United States Patent
Mallinson

(10) Patent No.: US 6,897,727 B2
(45) Date of Patent: May 24, 2005

(54) CURRENT MODE SWITCH CAPACITOR CIRCUIT

(75) Inventor: Andrew Martin Mallinson, Kelowna (CA)

(73) Assignee: ESS Technology, Inc., Fremont, CA (US)

(*) Notice: Subject to any disclaimer, the term of this patent is extended or adjusted under 35 U.S.C. 154(b) by 39 days.

(21) Appl. No.: 10/680,811

(22) Filed: Oct. 6, 2003

(65) Prior Publication Data

US 2004/0189390 A1 Sep. 30, 2004

Related U.S. Application Data

(60) Provisional application No. 60/458,908, filed on Mar. 28, 2003.

(51) Int. Cl.$^7$ ................................................ H03F 3/45
(52) U.S. Cl. ...................... 330/253; 330/258; 330/302; 330/311
(58) Field of Search ................................ 330/253, 258, 330/302, 311

(56) References Cited

U.S. PATENT DOCUMENTS

| | | | | |
|---|---|---|---|---|
| 4,271,394 A | * | 6/1981 | Leidich | 330/258 |
| 4,345,213 A | * | 8/1982 | Schade, Jr. | 330/253 |
| 4,912,423 A | * | 3/1990 | Milkovic et al. | 330/9 |
| 5,594,383 A | | 1/1997 | Tamba | |
| 5,838,199 A | | 11/1998 | Nakamura | |
| 5,905,399 A | * | 5/1999 | Bosnyak et al. | 327/384 |

* cited by examiner

Primary Examiner—Patricia Nguyen
(74) Attorney, Agent, or Firm—Stevens Law Group

(57) ABSTRACT

A device is provided having at least two capacitive elements configured to retain a charge, and an interconnection of active devices between the capacitive elements. The active devices are configured to operate upon a transient charge flow as a current when in operation. The charge flow is partitioned into at least two capacitors according to the input voltage difference acting as a controlling parameter.

11 Claims, 3 Drawing Sheets

CURRENT MODE SWITCH CAPACITOR CIRCUIT

RELATED APPLICATIONS

This application claims the benefit of U.S. Provisional Patent Application Ser. No. 60/458,908, filed Mar. 28, 2003

BACKGROUND

Conventional amplifiers configured to have current flowing into a common source of a pair of similar devices are well known in the art. The arrangement is commonly referred to as a "long-tailed pair", where the input signal is applied differentially between the gates of the pair of devices. A second stage of such an amplifier is derived from a load network of some kind, and can be a commonly used mirror arrangement of MOS devices. These may be NMOS devices, PMOS devices, a pair of JFET devices, bipolar devices, GasFETS, or any other three-terminal active device.

The current into the long tailed pair of devices is derived from a device configured as a current source that delivers constant current. One load network that is well known is commonly called a "current mirror" arrangement or a "folded cascode" arrangement. For example, a long tailed pair may be implemented with NMOS FET devices, where the common connection is the source of each device. The input is the voltage between the gates of the devices, and the output is the relative current levels in the drains of the devices. In most all uses of a long tailed pair, the circuit operates on a continuous input current, the "tail current". This current is a nominally fixed parameter and is split into the outputs of the long-tailed pair as controlled by the relative input voltages.

For example, in two devices arranged as along tailed pair, a current of 1 mA may be sunk from the common source connection. The gate voltage of the left hand device may be configured to be 10 mV higher than the gate voltage of the right hand device. As a result, the current flow in the left hand device drain will be higher than the current flow in the right hand device. For example, the left hand device may have a 600 $\mu$A drain current and the right hand device may have 400 $\mu$A drain current. Thus, the gate voltage difference has been converted into a drain current difference. The drain current difference is then passed to the load network, such as a mirror or folded cascode, and the current difference is processed to generate the signal to succeeding stages of the circuit.

In conventional circuits, the signal input representation is the voltage difference, and the signal output representation is the current difference. The load network operates to convert the current difference back to a voltage difference upon in which the next stage may operate. Therefore, the load network's primary characteristic is its impedance, the load network's transfer characteristic from current to voltage. This current to voltage conversion is necessitated by succeeding stages of the device, where the devices are voltage input devices, and may include other long tailed pairs. All cascode or folded cascode arrangements simply defer this ultimate and necessary step of current to voltage conversion. Consequently, in implementing a circuit with a long-tailed pair, a designer is concerned with the output impedance, since this will limit the maximum achievable resistance in the current to voltage conversion process, resulting in lower gain.

Consider further the means to generate the current input to the long-tailed pair. In the example above, this may be derived from a device configured as a current source, typically an NMOS FET with its source at ground and gate at a fixed bias voltage. This will generate a current in the drain that is roughly a constant current. This and other current source configurations have a limited output voltage over which the current is roughly constant. The output terminal has an output compliance voltage that limits the range of operating voltages of the long tailed pair. In one example, for NMOS devices, the input common mode range is limited at the low side by the saturation of the current source.

Switched capacitor circuits are also well known, where a charge is manipulated between capacitors to represent the signal being processed. Signal processing functions are implemented by possibly sharing charge with different sized capacitors or by inspecting the voltage present on a capacitor, thus related to its charge by Q=VC, and forcing this voltage to appear across a differently sized capacitor, thus re-creating a charge Qout=Qin*Cout/Cin. The element that connects the capacitors one to the other to enable charge flow is a switch. The resulting equilibrium condition that signals the end of the charge transfer process is the absence of any voltage across the switch. It is this final equilibrium condition, where there is no voltage across the switch that constrains all switched capacitor operations to be of the two types, charge sharing or intermediate voltage replication. As a result, after the charge transfer process is complete, no voltage exists across the switch.

Therefore, there exists a need for an amplifier circuit with less attenuation and higher gain, and with increased input common mode range. As will be seen below, the invention addresses these needs in an elegant manner.

SUMMARY

Figure 1:
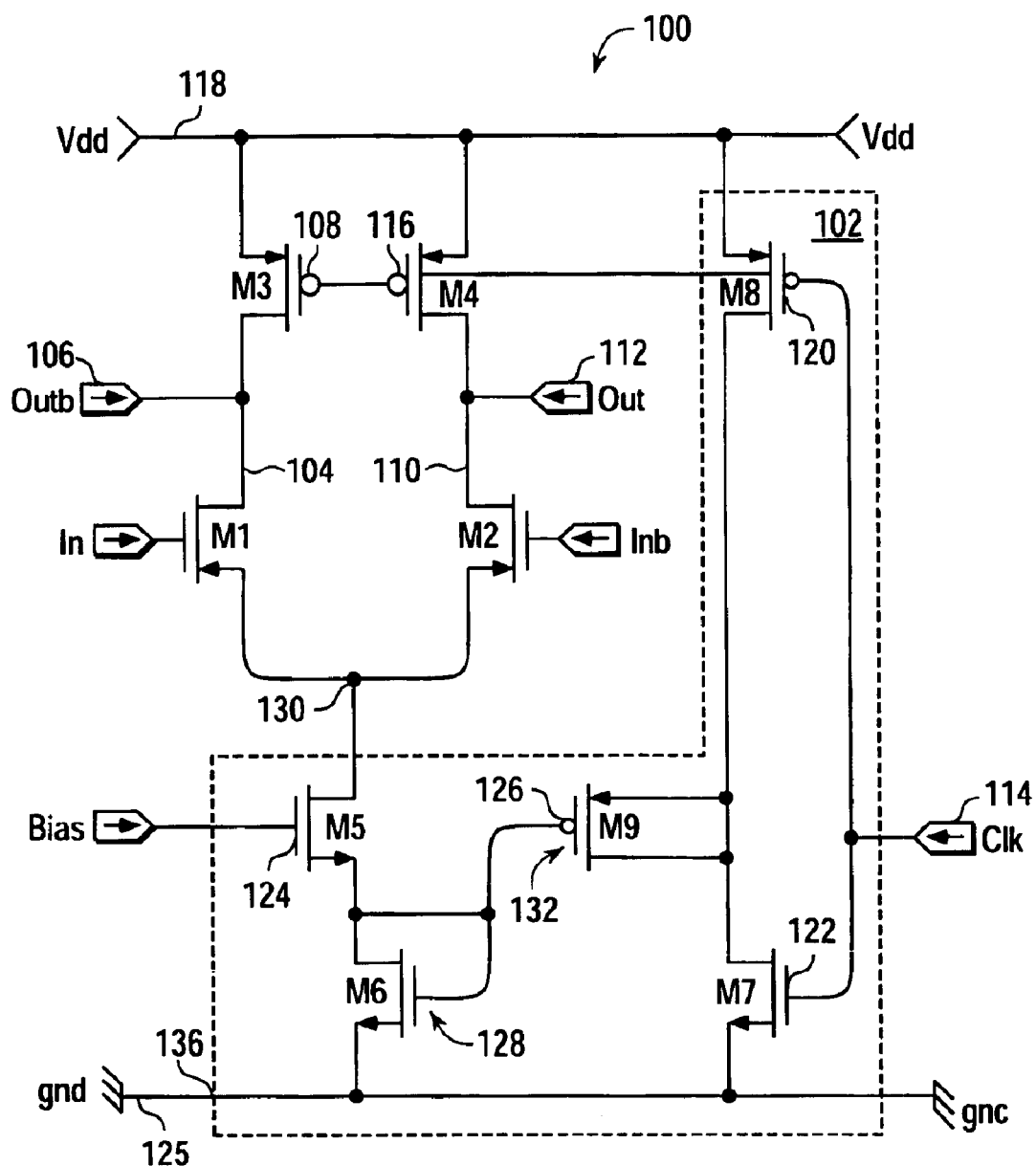
FIG. 1 is a block diagram of a circuit configured according to the invention.

A device is provided having at least two capacitive elements configured to retain a charge, and an interconnection of active devices between the capacitive elements. The active devices are configured to operate upon a transient charge flow as a current when in operation, wherein the charge flow is partitioned into at least two parts according to a controlling parameter. The invention enables a signal amplifier, wherein the active elements are three terminal devices configured as long tailed pairs, each having a commonly connected terminal. In operation, the transient charge flow enters the commonly connected terminals. The signal is divided into a partition that is the total charge sent to each output terminal. The controlling parameter is the input voltage difference. The long tailed pair may be configured to partition a charge that transiently flows between a first capacitor and two secondary capacitors such that, upon cessation of the transient current, an output voltage difference is expressed between the two secondary capacitors that is a representation of the input voltage between the two gate connections.

DETAILED DESCRIPTION

The invention provides an improvement upon known switched capacitor circuits wherein the charge that momentarily flows between the capacitive elements of a switched capacitor circuit is manipulated as a current flow and is partitioned into at least two parts by use of an active device or devices such that the ultimate disposition of the charge depends upon a defined input signal to the device or devices.

The result is an improved switched capacitor amplifier circuit with less attenuation and higher gain. Unlike conventional switched capacitor circuits, the circuit does not use a simple switch that drains the charge down to ultimately zero volts after transferring charge. Furthermore, it differs from known long-tailed-pairs because it requires no active load network and has no constant tail current.

In a circuit configured according to the invention, active intervening elements exist between the input charge and the output charge, such that, at the end of the charge transfer process, the voltage is not necessarily zero across the intermediate element. Also, the partition of charge is dependant upon an auxiliary input, where an input signal is applied differentially between the gates of two long tailed pair connected devices. The difference in the gate voltages of the long tailed pair devices is the auxiliary input. And, the difference in gate voltages is not necessarily related to the size or relative size of the capacitors.

Thus, the invention provides a switched capacitor circuit that utilizes a connection charge transferring means that does not necessarily have zero volts across it at the end of the charge transfer process. Further, the invention provides a partitioning of the charge that is dependant on an auxiliary input parameter. In the embodiment described below, that connection charge transferring means is a pair of transistors configured as a long tailed pair, and the auxiliary input parameter is the difference in gate voltages of the long tailed pair. It will be understood by those skilled in the art, however, that other particular circuit configurations are possible without departing from the spirit and scope of the invention, which is defined by the claims and their equivalents.

According to the invention, a circuit having a long tailed pair may be configured to utilize a finite time interval over which a specified current flows, such that a prescribed finite charge has passed at the end of this time interval. Further, the invention enables the use of the total charge that has been partitioned as the output parameter, rather than the rate of flow of charge as in the prior art, i.e. the current, during the finite time interval. Since the current ultimately ceases to flow, the circuit can collect all the current into a capacitor and asses the voltage difference as the output parameter. This will give a higher voltage difference than the use of resistive devices as in conventional circuits. Also, there is more potential voltage gain and less noise if the total actual charge is compared, rather than the current, which is the rate of charge flow.

One embodiment of the invention is derived by replacing two constituent elements of a known art long-tailed pair amplifier. The two parts replaced are the current source and the load network, or current mirror as it is commonly called in the art. The current source is replaced with the first of the capacitive elements as discussed above. The load network or current mirror, as it is commonly called, is replaced by two capacitors into which charge will be accumulated. As a result, at least two properties of the circuit have been enhanced. Firstly, the common mode voltage is improved. The circuit will operate with lower gate voltages on the long tailed pair gates. This advantage accrues from the bias point that may be chosen to be used for the cascode device. Therefore, the switched capacitor may be driven below the nominal ground voltage and still operate. According to the invention, and as discussed further below, that bias point can be lower than the voltage used for the conventional constant current source equivalent. Therefore, the input common range is extended on the low side, so it can be configured to go lower. Secondly, the gain is higher; because the current flow is not indefinite as in conventional circuits and so the total change difference may be assessed. The total current flow is limited to the charge that was initially only the capacitive element that now replaces the current source. Therefore, the circuit can accumulate all of the charge emerging from the drain of the long tailed pair devices into the capacitors used to replace the mirror load. And, there is no gain reduction due to the finite resistance of the load on the long tailed pair as in conventional circuits.

In one embodiment, a circuit is provided that includes a long tailed pair of transistors connected to a common voltage source at one end, and joined together to connect to a cascode device at another end. The cascode device is connected at its other end to a switched capacitor circuit. And, the gate of the cascode device is connected to a bias voltage source. The switched capacitor circuit further includes a capacitor connected at one end of the cascode device, and at another end to one end of a switch. The switch is connected at another end to the common voltage source. The configuration of cascode device, capacitor, switch and resistive device are used to generate a transient current into the long-tailed-pair. The transient current flows while the capacitor charges through the resistive device. The cascode device couples this transient current into the long-tailed-pair.

In contrast, the conventional current source configuration has a limited output voltage over which the current is roughly constant, where the output terminal has an output compliance voltage. The output terminal of the current source has an output compliant voltage. The output compliance voltage limits the range of operating voltages of the long tailed pair. Thus, as discussed in the background, with the NMOS devices in a conventional system, the input common mode range is limited at the low side by the saturation of the current source feeding current to the common node of the long tailed pair. This point is the point at which the output is no longer roughly a constant current. In a circuit configured according to the invention, the switched capacitor replacement of the current source enhances the common mode voltage. More particularly, the cascode device may have a gate bias voltage lower than that necessary for a conventional current source. Hence the transfer of transient change from the switched capacitor will operate in a condition of drain voltage lower than the saturation voltage of the current source. This translates into an increase of the common-mode voltage, since the common mode voltage may now extend to a lower level.

In conventional systems, the output impedance has two components, the long tailed pair itself and a current source. The impedance is the parallel combination of these components. In the embodiment here described, the load network is removed and replaced with two capacitors, one on each drain. Accordingly, utilizing the invention, the entire charge as accumulated on these two load capacitors can be used as an output parameter, rather than the rate of charge, or the current as in conventional systems. This provides a circuit having a higher voltage difference, more gain and less noise.

One embodiment of the invention provides a signal amplifier having at least three capacitive elements configured to retain a charge, and an interconnection of active devices between these capacitive elements in the amplifier. The interconnection is configured to operate upon a transient charge flow as a current when in operation. The charge flow is partitioned into at least two parts according to a controlling parameter. In one embodiment, the active devices are three terminal devices, such as transistors. The active elements may further be configured as long tailed pairs, each having a commonly connected terminal. In such a configuration, the transient charge flow enters the commonly connected terminals, and the partition is the total charge sent to each output terminal. The controlling parameter is the input voltage difference.

In a particular embodiment, the three terminal devices may be MOSFET devices. In this configuration, the commonly connected terminals are the source terminals of the devices, and the partition is the total charge sent to the separate drain terminals. The controlling parameter is the voltage difference between the gate connections.

The signal amplifier may further include a first capacitor and at least two secondary capacitors. In this embodiment, the long tailed pair is configured to partition a charge that transiently flows between the first capacitor and the two secondary capacitors. Upon cessation of the transient current, an output voltage difference is expressed between the two secondary capacitors that is a representation of the input voltage between the two gate connections.

Referring to FIG. 1, an embodiment of the invention is illustrated. The switched capacitor circuit 102 operates to transfer charge on and off the gate of M9 132. The gate 126 of M9 constitutes one of the capacitive elements of a switched capacitor circuit. The capacitance on the node 104 named as "Outb" 106 connected to the drains of M1 and M3 108 forms a second capacitive element. The capacitance on the node 110 labeled "Out" 112 forms a third capacitive element. These latter two capacitive elements form two parts into which charge will be partitioned. The Clk signal 114 connects to the gate of devices M3 108 and M4 116 such that when the Clk signal is low the voltage on the second capacitive element (node 104) and the voltage on the third capacitive element (node 110) are well defined—being that voltage Vdd on the node 118. M3 108 and M4 116 therefore operate to initialize the output voltage on nodes 104 and 110. PMOS device M8 is a switch, connected at its source to reference voltage rail 118 and at its drain to the drain of current source M7, 122, a weak NMOS device having a length and width ratio such that it relatively slowly discharges the capacitance of M9. These devices M7 and M8 are configured to be driven at their gates by clock 114. Cascode device M5 124 causes charge flowing on to the gate M9 126 to flow through its drain, diode device M6 128 causes charge flowing off of the gate of M9 126 to flow from the ground node 125. The capacitor providing the source of charge is the gate 126 of PMOS device M9, 132, with its gate connected to the source of cascode device 124 and gate and drain of the diode NMOS device M6, 128. The Bias voltage at the gate of M5 124 is set up such that the diode connected device M6 128 and the cascode device M5 124 are not both on. More particularly, in the absence of any current flow on or off the gate capacitance of M9 132, no current will flow in M5 drain.

In operation, on each rising edge of the clock signal 114, a well defined amount of charge will pass at a well defined rate into the common source of M1 and M2. The amount of charge is that charge on the gate of M9 132, the defined rate is set by the aspect ratio of the resistive device M7 122. This is a well defined amount of charge passing at a predictable rate and constitutes the transient charge flow passing as a current. These charges will be sent as distinct packets of charge, one flowing into the drain of M1 and one flowing into the drain of M2. The elements M1 and M2 are the active devices that partition the charge. The amount of charge that flows into the drain node of M1 and M2 will differ if the gate voltage of M1 (the In signal) differs from the gate voltage of M2 (the Inb signal). The voltage difference between In and Inb constitutes the controlling parameter. The partitioned charge will emerge from the drains of M1 and M2 and be stored on the aforementioned capacitors associated with nodes 104 and 110. Thus a switched capacitor operation has been performed—charge from the capacitive element M9 gate 126 has been transferred to capacitive elements on nodes 104 and 110. The transient charge flow was operated upon as a current through M5 drains into node 130. The charge in this current flow was partitioned into two parts by active elements M1 and M2 under the control of a parameter, the voltage between In and Inb. The resulting partitioned charge is now resident on the capacitors associated with nodes 104 and 110.

Figure 2:
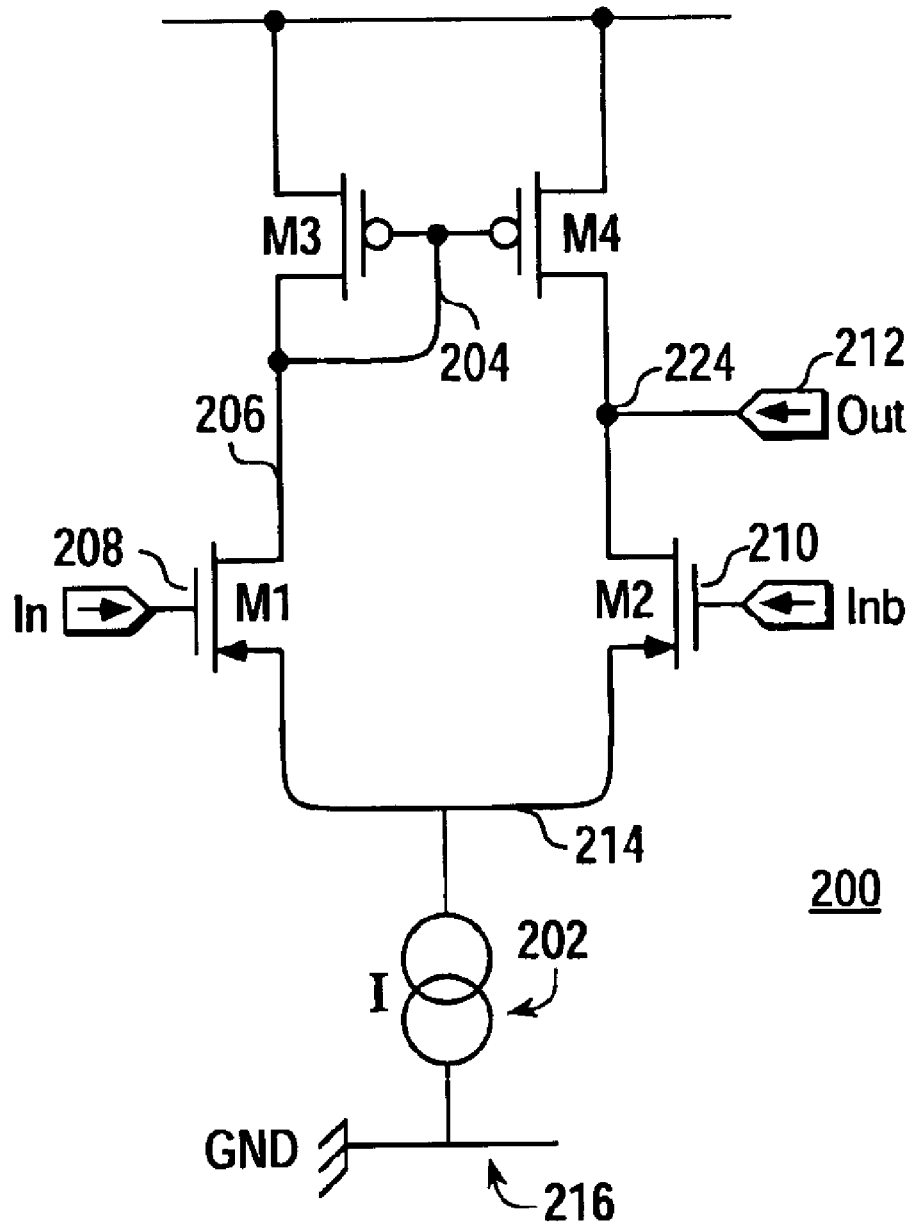
FIG. 2 is a block diagram of a circuit configured according to the prior art.

This embodiment of the invention will now be contrasted with known art for purposes of explaining the advantages. Those skilled in the art will note the similarity between this example implementation and a conventional long tailed pair amplifier. FIG. 2 shows a prior art implementation of a long tailed pair amplifier 200. Conventional current sink element I 202 replaces the switched capacitor elements 102 of FIG. 1, the device M3 and M4 are configured as a current mirror by wire 204 between the gate and the node 206. The circuit operates to amplify the signal between In 208 and Inb 210 and present that amplified signal on the node 212 Out.

Two parameters of this conventional circuit are improved by use of the invention. Firstly, the signal gain of this circuit is determined by the ratio of the impedance at the output node to the transimpedance of the input pair. It is desirable to get high gain in an amplifier. And, by definition, the higher the impedance at the output node, the higher the gain in the amplifier. The impedance at the output node is the parallel combination of the impedance of the drain of M4 and the impedance of the drain of M2. The impedance of the drain of M4 is not infinitely high since M4 drain is conducting current. In a circuit configured according to the invention, the drain of M4 (and similarly of M3) is not conducting current, thus its output impedance is essentially infinite, and thus the gain is higher. Secondly, in the conventional circuit, the absolute voltage at the node In or Inb, known as the common mode voltage, is limited to those voltage values that do not result in the cut off of the current source device I 202. The source I 202 may be optimized to operate with a very small voltage difference between node 214 and the ground node 216, but the voltage on node 214 must at all times be greater than the voltage on node 216. Thus, a lower limit is placed upon the common mode voltage by the current source connected to node 214. In an example of an implementation with an NMOS device having thresholds of approximately 0.5 volts and a current source designed to operate to 0.2 volts, the common mode lower limit would be approximately 0.7 v.

In an example of the embodiment of the invention described in FIG. 1, the transient current flow from the gate of M9 is directed by cascode device M5 into the node 130. Cascode device M5 may be operated with a gate voltage (Bias on FIG. 1) at a low voltage indeed even the same voltage as on node 136 and in this condition the drain of M5 will operate at a voltage potentially below that of node 136—the voltage on node 130 may be below the voltage on node 136 and the common mode voltage will be significantly lower. For example, in a typical process with NMOS thresholds at 0.5 v the node Bias may be tied to node 136, assumed to be ground for this example. When the clock Clk 114 goes high, the source of M5 will be driven below ground and the transient charge flow into node 130 will operate as expected when node 130 is as low as −0.3 v. Thus the common mode lower limit will be about 0.2 v, an improvement upon the prior art.

Generally, the invention provides a mechanism for the processing of charge as a signal representation medium. An intervening element exists between the input charge and the output charge, such that, at the end of the charge transfer process, two conditions prevail. First, the voltage is not necessarily zero across the intermediate element. Second, the partition of charge was possibly dependant upon an auxiliary input that is not related to the size or relative size of the capacitors.

Thus, the invention provides an improvement to switched capacitor circuit techniques, where the new element is, in its most general sense, the use of a connection charge transferring means that does not necessarily have zero volts across it at the end of the process, and the partitioning of the charge may have depended on an auxiliary input parameter. In the embodiment described above, that element is the long tailed pair and the auxiliary input parameter is the difference in gate voltages.

Figure 3:
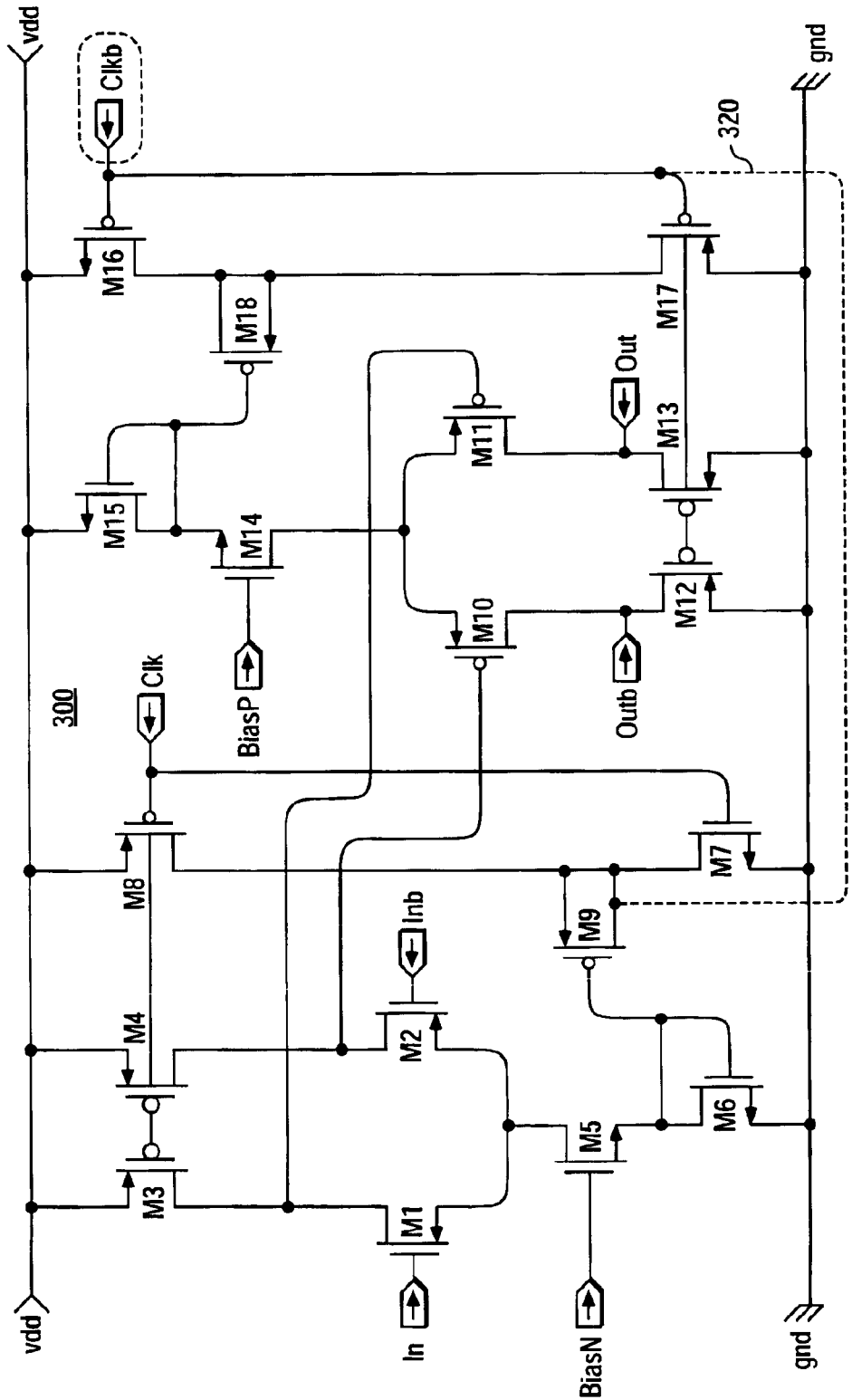
FIG. 3 is a block diagram of a circuit configured according to the invention.

Referring to FIG. 3, anther embodiment of the invention is illustrated, where a second stage is developed that is a duplicate of the first stage of FIG. 1, where the NMOS devices are replaced with PMOS devices, and visa-verse. Those skilled in the art will understand that the circuit can be configured so that the NMOS and PMOS devices are interchangeable without departing from the invention, and that the invention is not limited to any particular component configuration. The charge defined by the device M9 (a PMOS device) will end up on the gates of M10 and M11 (also PMOS devices), and so a degree of process variation is compensated. More particularly, if the capacitor has a thin oxide, the gate capacitance would be higher. Therefore, the charge transferred will be higher, but would accumulate on a gate that has itself a higher capacitance, thus creating the same output voltage. Thus, the capacitor generating the charge and the capacitor receiving the charge may each be varied, and there is no loss of voltage gain.

In this embodiment, the clock now becomes two-phase, where the Clk signal rises to create a voltage difference on the M10 and M11 gates. Then, Clkb subsequently rises to create a greater voltage difference on Out and Outb (the M12 and M13 drains). As a result, the component is a two phase high gain amplifier. If alternative clock connection 320 is connected, and Clkb is eliminated, and only one clock is needed.

The invention has been described in the context of a signal amplifier having improved characteristics. Those skilled in the art will understand, however, that this is just one embodiment of the invention, the scope of which is defined by the appended claims and their equivalents.

What is claimed is:

1. A signal amplifier comprising:
    at least two capacitive elements configured to retain a charge;
    an interconnection of active devices between the at least two capacitive elements configured to operate upon a transient charge flow as a current when in operation, wherein the charge flow is partitioned into at least two parts according to a controlling parameter.

2. A signal amplifier according to claim 1 wherein the at least two active elements are three terminal devices.

3. A signal amplifier according to claim 1 wherein the at least two active elements are three terminal devices configured as long tailed pairs, each having a commonly connected terminal, wherein the transient charge flow enters the commonly connected terminals, and the signal amplifier further comprising a partition defined by the total charge sent to each output terminal and the controlling parameter is the input voltage difference.

4. A signal amplifier according to claim 3, wherein the three terminal devices are MOSFET devices, wherein the commonly connected terminals are the source terminals of the devices, wherein the partition is the total charge sent to the separate drain terminals and wherein the controlling parameter is the voltage difference between the gate connections.

5. A signal amplifier according to claim 3 further comprising a first capacitor and at least two secondary capacitors, wherein the long tailed pair is configured to partition a charge that transiently flows between the first capacitor and the two secondary capacitors such that, upon cessation of the transient current, an output voltage difference is expressed between the two secondary capacitors that is a representation of the input voltage between the two gate connections.

6. A signal amplifier according to claim 3 wherein the output voltage is an amplified version of the input voltage.

7. A current mode switched capacitor comprising:
    a long tailed pair of transistors, each having one terminal connected to a common voltage source and each connected in common by another terminal;
    a cascode device connected at one terminal to the connected terminals of the long tailed pair;
    a switched capacitor circuit connected on one end to another terminal of the cascode device and at another end to ground, and where the gate of the cascode device is connected to a bias voltage source, the switched capacitor circuit having a capacitor connected at one terminal to the source of the cascode device, and a switch connected at one terminal to the cascode device, another terminal connected to one end of a grounded current source, and yet another terminal connected to the common voltage source.

8. A method of amplifying a signal, comprising:
    receiving an input signal;
    opening a switch to cause the current from a current source to flow through the long tailed pair via the cascode device until the voltage in the capacitor drops;
    cutting off the current source in response to the voltage in the capacitor dropping; and
    closing the switch to cause the capacitor to charge up to the reference voltage.

9. A circuit, comprising:
    a load circuit configured to generate a load current in response to an input signal;
    an improved switched capacitor circuit configured to, wherein the switched capacitor includes a connection charge transferring circuit configured to utilize the charge transiently entering or leaving the switched capacitor circuit as an output parameter, retain this charge after a charge transfer, wherein the partitioning of the charge may have depended on an auxiliary input parameter.

10. A circuit according to claim 3, further comprising a long tailed pair, wherein the auxiliary input parameter is the difference in input gate voltages.

11. A circuit comprising:
    a long tailed pair input circuit configured to operate over a finite time interval over which a specified current flows such that a prescribed finite charge has passed at the end of this time interval, the circuit being configured to assess the total charge that has been partitioned as an output parameter during a finite time interval.

* * * * *